US008184747B2

(12) United States Patent
Baker et al.

(10) Patent No.: US 8,184,747 B2
(45) Date of Patent: May 22, 2012

(54) FLEXIBLE TIMEBASE FOR EYE DIAGRAM

(75) Inventors: Daniel G. Baker, Beaverton, OR (US);
Barry A. McKibben, Beaverton, OR (US); Michael D. Nakamura, Portland, OR (US); Evan Albright, Portland, OR (US); Scott E. Zink, Portland, OR (US);
Michael S. Overton, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1166 days.

(21) Appl. No.: 11/274,687

(22) Filed: Nov. 14, 2005

(65) Prior Publication Data

US 2007/0121714 A1 May 31, 2007

(51) Int. Cl.
*H04L 27/00* (2006.01)
*H04B 3/46* (2006.01)

(52) U.S. Cl. ........................... 375/326; 375/224

(58) Field of Classification Search .................. 375/326, 375/324, 322, 316
See application file for complete search history.

(56) References Cited

U.S. PATENT DOCUMENTS

| 4,894,842 | A * | 1/1990 | Broekhoven et al. ......... 375/150 |
| 5,245,630 | A | 9/1993 | Ainsworth |
| 5,260,670 | A | 11/1993 | Ainsworth |
| 6,532,271 | B1 * | 3/2003 | Hwang et al. ................ 375/326 |
| 7,532,697 | B1 | 5/2009 | Sidiropoulos et al. |
| 2002/0067887 | A1 * | 6/2002 | Tomlinson et al. ............. 385/37 |
| 2004/0057503 | A1 * | 3/2004 | Kelley ............................ 375/148 |
| 2005/0169362 | A1 * | 8/2005 | Schenk .......................... 375/234 |
| 2005/0267695 | A1 * | 12/2005 | German .......................... 702/41 |
| 2006/0025945 | A1 | 2/2006 | Blanc et al. |
| 2006/0227915 | A1 | 10/2006 | Millman |
| 2007/0189195 | A1 * | 8/2007 | Belotserkovsky ............ 370/315 |

FOREIGN PATENT DOCUMENTS

WO WO 03067751 A2 * 8/2003

OTHER PUBLICATIONS

Ray Andraka, "A Survey of CORDIC Algorithms for FPGA Based Computers", Andraka Consulting Group, Inc., North Kingstown, RI.
Co-pending U.S. Appl. No. 13/178,803 filed On Jul. 8, 2011.
Non-Final Rejection dated Nov. 4, 2011 received in co-pending U.S. Appl. No. 13/178,803.

* cited by examiner

*Primary Examiner* — David C. Payne
*Assistant Examiner* — Brian J Stevens
(74) *Attorney, Agent, or Firm* — Francis I. Gray; Michael A. Nelson

(57) ABSTRACT

A flexible timebase for eye diagrams uses a stable free running oscillator as a sample clock for equivalent time sampling of an input serial digital signal and of a reference signal derived from a subdivided recovered clock of the input serial digital signal. The reference signal samples are provided to a digital phase-locked loop that provides the flexible timebase to an eye pattern generator. The eye pattern generator accumulates the input serial digital signal samples at times corresponding to the reference signal samples to produce the eye diagram. A linear phase detector in the digital phase locked loop converts the reference signal samples to a complex signal using a Hilbert transform and then to a linear ramp of phase values using a CORDIC algorithm with arctangent lookup table. The digital phase-locked loop feedback is subtracted from the linear ramp to provide the input to the loop filter.

1 Claim, 3 Drawing Sheets

FLEXIBLE TIMEBASE FOR EYE DIAGRAM

BACKGROUND OF THE INVENTION

The present invention relates to the test and measurement of serial digital information, such as in a serial data communications system, and more particularly to a flexible timebase for EYE diagrams.

The uses of EYE diagrams to evaluate serial data communications systems, especially ones with an embedded clock, are well established. Many modern test instruments, such as oscilloscopes and waveform monitors, use EYE diagrams. There are several ways in use to generate the timebase for the EYE diagram.

1) Oscilloscopes traditionally use a direct trigger timebase.
2) A little used method has a free running timebase that is manually tuned to match the timebase of the incoming serial data.
3) Another method uses a phase-locked loop (PLL) derived timebase. The PLL derived timebase is sometimes preferred because it mimics the action of a clock recovery circuit to some degree. This allows a user to see jitter in the serial data stream timebase that may cause problems in data recovery, which problems are hidden by the direct trigger method. The PLL derived timebase may hide problems that are of less concern, but which are emphasized in the manually tuned method. If the loop bandwidth of the PLL is tunable, this allows the user to see or hide various elements of the jitter. As an extra benefit the PLL may be used to supply a "jitter demodulation" or "jitter demod" function where the jitter in the incoming serial data stream may be visualized as an edge-deflection or jitter versus time graph. The jitter demod function is very useful in identifying deterministic sources of jitter.

There are a few problems with the PLL derived timebase method. To be useful as a jitter evaluation tool the timebase of the measurement instrument has to be much better than the timebase of the incoming serial data. To get this degree of quality usually requires a stable timebase, but the requirement of a PLL is that the timebase be "pullable", i.e., variable. In modern systems, such as television studio video delivery systems, there are several different data rates that add rate flexibility to the list of requirements. Such flexibility contradicts the basic timebase stability requirement. For an instrument that only has to deal with one data rate, such as 270 megabits per second, the timebase may be implemented as a phase-locked crystal. This works well, but there is a limit of about 10 KHz to loop bandwidth due to the crystal. To extend this to several data rate standards requires a separate crystal for each standard. To overcome this limitation direct digital synthesis of the timebase may be used. Although this is workable, the resulting analog design is somewhat complex and touchy.

With the advances being made in analog-to-digital converters and the decrease in price of digital processing, one may directly digitize the incoming serial data stream and recover the clock of the serial data stream via digital signal processing. A numerical controlled oscillator (NCO) may then be phase-locked to the recovered clock and used to derive the timebase for the EYE diagram. The quality of the timebase is dependent upon the quality of the sample clock for the analog-to-digital conversion, the quality of the analog-to-digital converter and the bit resolution carried through with the digital signal processing. However there is a problem when working with high data rates, such as the 1.5 gigabit per second high definition television rate, since the analog-to-digital converter required is quite expensive and the high quality, high frequency sampling clock is hard to achieve. The jitter performance of this method also is dependent to some degree on the record length of the serial data. Very long record lengths at high data rates are expensive.

Equivalent time sampling of a serial data signal for EYE diagrams using a high bandwidth sampler and a low frequency analog-to-digital converter (ADC) is known. However the difficulty is in deriving a stable, accurate timebase to achieve this. The sampling needs to be at twice the bandwidth of the jitter sidebands, which is set by the bandwidth of the clock recovery circuit.

What is desired is a method of combining the stability of a free running timebase with the advantages of a PLL timebase without using expensive analog-to-digital converters or hard to achieve high frequency sampling clocks while still maintaining the ability to evaluate timebase jitter.

BRIEF SUMMARY OF THE INVENTION

Accordingly the present invention provides a flexible timebase for EYE diagrams by recovering a clock signal from an input serial digital signal, subdividing the recovered clock signal to produce a reference signal at a convenient frequency (such as a sine wave), equivalent time sampling the input serial digital signal and the reference signal using a stable free running oscillator to produce data pairs, and generating from the data pairs an eye pattern. A digital phase-locked loop is used to generate the flexible timebase from the sampled reference signal values. The digital phase-locked loop includes a phase detector, a loop filter and a numerical controlled oscillator, the output from the numerical controlled oscillator providing the timebase for generating the eye pattern and the output from the phase detector providing a jitter demod output for jitter analysis of the input serial digital signal timebase. The sampled reference signal values are preferably preprocessed to convert the sample reference signal values into a linear ramp of phase values, and the phase detector is then implemented as a subtraction circuit to subtract the feedback output from the numerical controlled oscillator from the linear ramp of phase values to provide the error (titter demod) signal for input to the loop filter.

The objects, advantages and other novel features of the present invention are apparent from the following detailed description when read in conjunction with the appended claims and attached drawing.

DETAILED DESCRIPTION OF THE INVENTION

Figure 1:
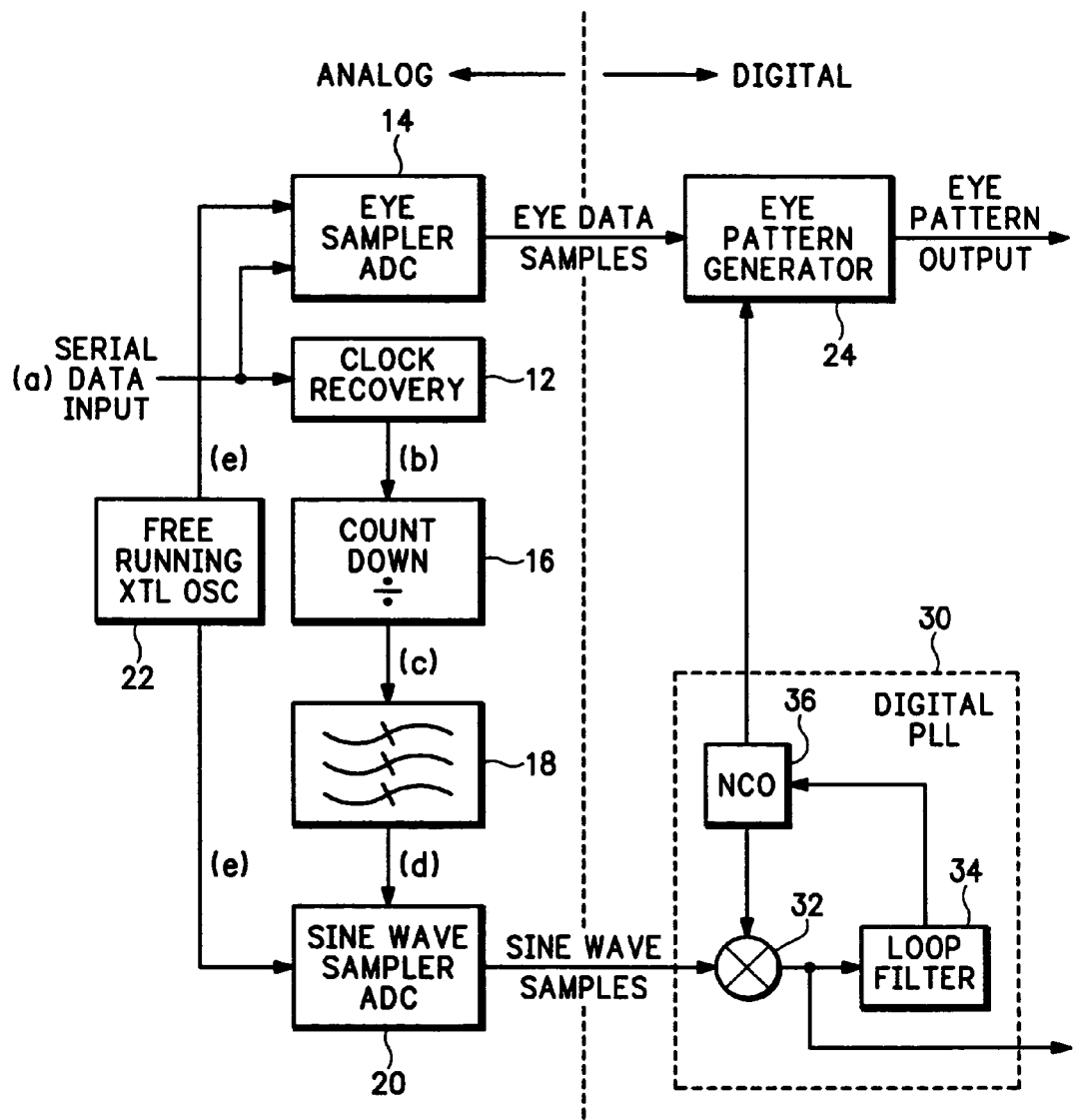
FIG. 1 is a block diagram view of a flexible timebase system for EYE diagrams according to the present invention.
Figure 2:
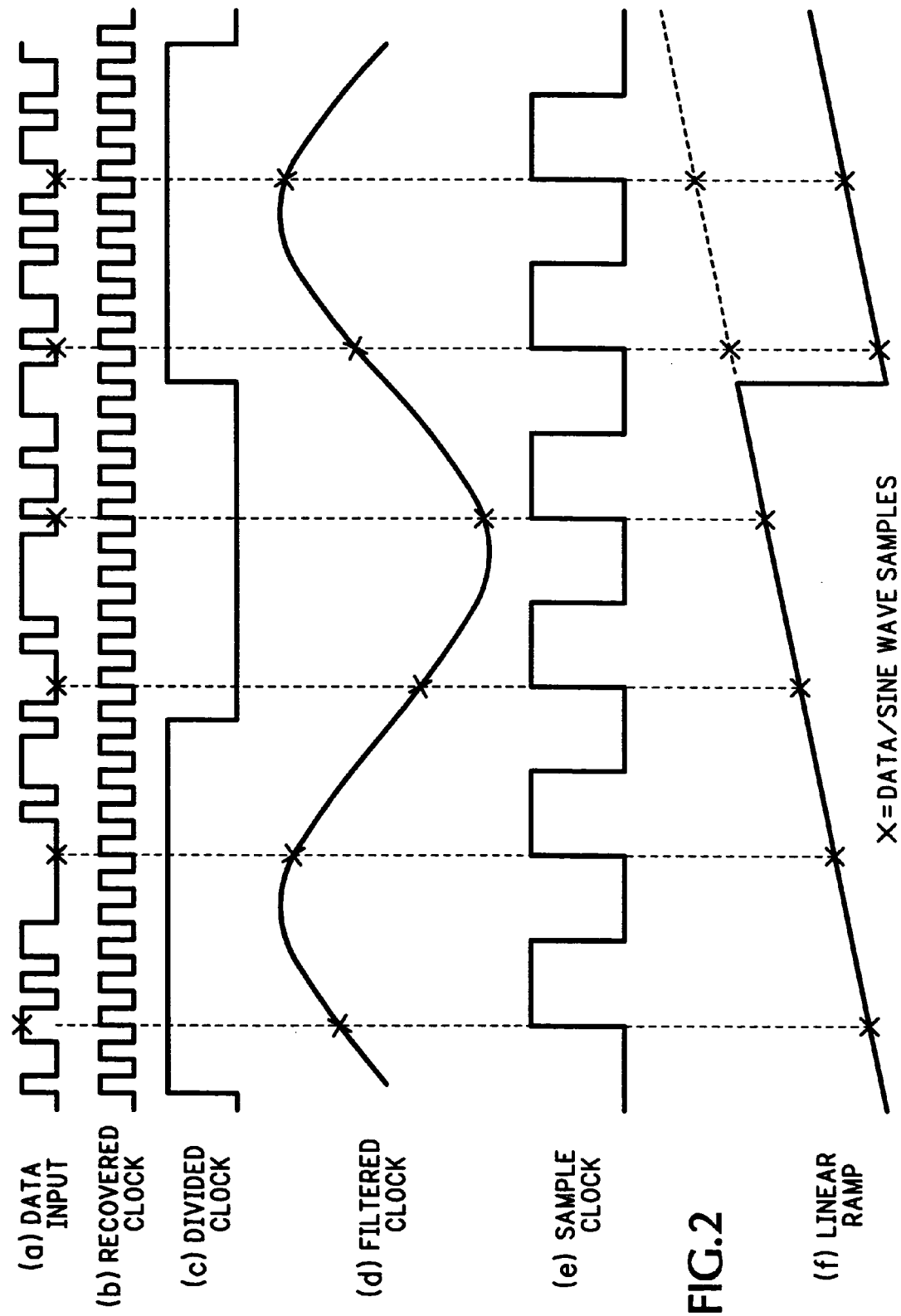
FIG. 2 is a waveform diagram view for the flexible timebase system of FIG. 1.

Referring now to FIGS. 1 and 2 an incoming serial data signal (a) is input to a clock recovery circuit 12 and to an equivalent time data sampling analog-to-digital converter (ADC) 14. A recovered clock (b) from the clock recovery circuit 12 is divided by a countdown register 16 and converted by a lowpass or bandpass filter 18 to a subdivided recovered clock (c) in the form of a reference signal, such as a sine wave (d), at a convenient frequency, such as $\frac{1}{20}$ of the recovered clock frequency. A sine wave is preferred as the reference signal since it may be sampled below the Nyquist limit and still result in a recovered sine wave, although a subharmonic of the sampled sine wave. The following discussion uses the sine wave as the reference signal for illustration. The filter 18 retains desired, but also divided, jitter sidebands. Only a small range (approximately 100 KHz) of sidebands are needed for the EYE diagram, but the entire sideband bandwidth of the clock recovery is needed for a continuous, real-time jitter demod (time interval error—T.I.E.) waveform. The sine wave (d) is input to a sine wave sampling ADC 20. A free running timebase crystal oscillator 22 provides a clock input (e) to both the equivalent time data sampler 14 and the sine wave sampler 20 to provide eye data samples and sine wave samples respectively.

The sine wave samples are input to a digital phase-locked loop (PLL) 30 that includes a phase detector 32, a loop filter 34 and a numerical controlled oscillator (NCO) 36. The digital PLL 30 locks the NCO 36 to the sine wave represented by the sine wave samples. As indicated above, the sine wave samples may represent an undersampled clock so long as the sample rate is greater than the Nyquist limit for the jitter bandwidth. The NCO 36 sends timebase information to an eye pattern generator 24 that combines the timebase information with the eye samples to make an eye pattern. The output of the phase detector 32 may also be used as a jitter demod output, with the low frequency range limit determined by the digital PLL bandwidth and type. A Type III feedback control PLL is the preferred embodiment for the digital PLL 30 which is unique for jitter measurements, but necessary for wander rejection as described in IEEE P1521-2003 "IEEE Trial-Use Standard for Measurement of Video Jitter and Wander." (http:///standards/ieee.org/reading/ieee/std/comm/1521-203.pdf) The high frequency range limit of the jitter demod is bounded by the clock recovery circuit 12 from which the sampled sine wave is derived so that the retained sampled sinewave sidebands need be no more than the clock recovery bandwidth. The eye pattern generator 24 provides x,y paired data for a conventional raster scan display processor (not shown).

Ideally the eye data samples represent amplitude (Y) values for input to the eye pattern generator 24, while the corresponding sine wave samples represent time (X) values for input to the eye pattern generator, i.e., the amplitudes of the sampled sine wave represent a time from an initial point of the input signal. Preferably the sine wave samples are used as the input to the digital PLL 30, and the timebase samples are derived from the NCO 36. A sine wave is used as a reference in many applications, such as the carrier in a communication system or a filtered square wave reference signal. In the present case the sine wave is digitized, allowing the use of the digital PLL 30. An advantage of the digital PLL 30 is that there are no analog circuits to drift out of specification, and the loop is often implemented inside an existing digital signal processor (DSP), field programmable gate array (FPGA), application specific integrated circuit (ASIC) or computer processing unit (CPU). The traditional sine wave phase detector 32 shown in FIG. 1 involves demodulating the reference sine wave using a multiplier and a sine wave generated from the feedback of the loop. The feedback sine wave is usually generated from an overflow accumulator ramp signal using a sine wave lookup table in the NCO 36. The disadvantage of using a sine wave demodulator as the phase detector 32 is that the transfer function is sinusoidal and, for large variations in phase such as jitter, the phase detector moves outside the linear region of the sine response and begins compressing.

Figure 3:
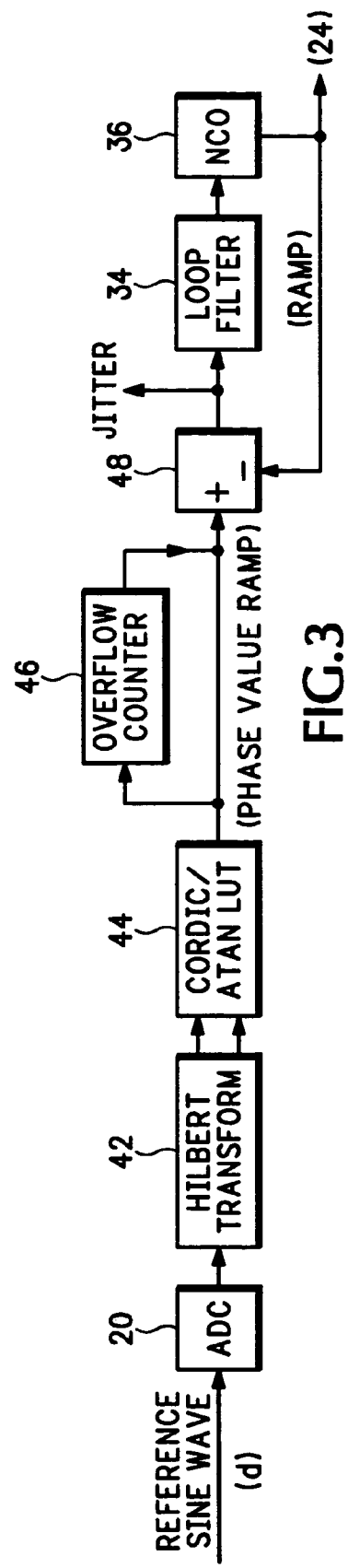
FIG. 3 is a block diagram view of a linear phase detector for use in the flexible timebase system according to the present invention.

A digital phase detector having a linear response for use as the phase detector 32 is shown in FIG. 3. The objective is to convert the sine wave reference signal into a linear ramp signal (f) of phase values and then subtract a ramp signal derived from the feedback loop of the NCO 36. The sine wave samples from the sine wave sampler 20 are preprocessed by deriving a complex signal (sine and cosine) using a discrete Hilbert transform 42, preferably having a bandwidth greater than the desired jitter bandwidth. The complex signal is converted to a ramp of phase values using an algorithm, such as a trigonometric function known as a CORDIC (COordinate Rotation Digital Computer) algorithm, and/or an arctangent lookup table 44. The arctangent lookup table by itself may be prohibitively large due to the dynamic range of the arctangent function, but the dynamic range is reduced when used as part of the CORDIC algorithm. The ramp signal (f) derived from the feedback of the PLL is simply the values that normally drive the addresses of the sine wave lookup table in the conventional demodulator phase detector, i.e., the output of the NCO 36. If complex sampling of the reference sine wave is used initially, then the Hilbert transform 42 may be bypassed. The CORDIC/AtanLut 44 converts the complex signal to the phase ramp signal (f). An overflow counter 46 may be used to add dynamic range to the input of a subtractor 48 that serves as the phase detector. When the most significant bit of the phase ramp rolls over, the overflow counter 46 is incremented. The overflow counter 46 provides the most significant bits of the phase ramp by concatenating the original phase ramp (f) with the output of the overflow counter (see the dotted line extension of the linear ramp (f) of FIG. 2). The overflow counter 46 provides the ability to handle large amounts of jitter. The feedback value may create large offsets to the phase detector 48 when attempting to acquire lock, which in conjunction with large jitter causes the phase detector to overflow when it shouldn't, resulting in loss of desired lock. The overflow counter 46 adds a few bits, the number of which are determined by the amount of overshoot in the loop to prevent undesired overflows. The feedback ramp of the loop is subtracted from the concatenated phase value by the phase detector 48, and the result is filtered by the loop filter 34 to create the NCO control value. The NCO 36 provides the feedback ramp to the phase detector, which is also the timebase for the eye pattern generator 24. The loop filter 34 tracks the low frequency component of the phase error (wander) from the detector 48, thus the jitter is not canceled out at the output from the phase detector. Therefore the output from the phase detector 48 provides a jitter demod output for jitter analysis.

The digital PLL 30 having the linear phase detector 48 runs faster due to the elimination of a ramp-to-sine wave lookup table (generally part of the NCO 36 that converts an overflowing accumulator ramp signal to a sine wave) in the feedback loop and of the delay due to the multiplier 32. The sampled linear ramp amplitude provides a time value (x-axis) for the correspondingly sampled signal data (y-axis), as shown in FIG. 2. The eye pattern generator 24 accumulates the asynchronously sampled x,y data pairs and builds up the EYE diagram, which is then transmitted to the display processor, as indicated above.

Thus the present invention provides a flexible timebase for EYE diagrams by recovering a clock signal from an input serial digital signal, dividing the clock signal to produce a sine wave at a convenient frequency, asynchronously sampling the input serial digital signal and the sine wave using a free running oscillator, and generating an eye pattern from the asynchronously sampled data and sine wave.

What is claimed is:

1. A linear phase detector for use in a digital phase-locked loop comprising:
   means for preprocessing a sampled reference signal to produce a complex signal;
   means for converting the complex signal to a linear ramp of phase values;
   means for subtracting a feedback signal of the digital phase locked loop from the linear ramp to produce an input to a loop filter of the digital phase-locked loop; and
   means for counting each cycle of the linear ramp to provide bits for concatenation with the linear ramp to achieve a desired dynamic range for the subtracting means.

* * * * *